US008084362B2

(12) United States Patent
Amanokura et al.

(10) Patent No.: US 8,084,362 B2
(45) Date of Patent: Dec. 27, 2011

(54) POLISHING SLURRY AND POLISHING METHOD

(75) Inventors: Jin Amanokura, Ibaraki (JP); Takafumi Sakurada, Ibaraki (JP); Sou Anzai, Ibaraki (JP); Masato Fukasawa, Ibaraki (JP); Shouichi Sasaki, Ibaraki (JP)

(73) Assignee: Hitachi Chemical Co., Ltd., Tokyo (JP)

( * ) Notice: Subject to any disclaimer, the term of this patent is extended or adjusted under 35 U.S.C. 154(b) by 716 days.

(21) Appl. No.: 11/802,813

(22) Filed: May 25, 2007

(65) Prior Publication Data
US 2007/0232197 A1 Oct. 4, 2007

Related U.S. Application Data

(62) Division of application No. 10/493,867, filed as application No. PCT/JP02/11370 on Oct. 31, 2002, now abandoned.

(30) Foreign Application Priority Data

Oct. 31, 2001 (JP) ............................... P2001-334376
Jan. 18, 2002 (JP) ............................... P2002-010280
May 31, 2002 (JP) ............................... P2002-160181

(51) Int. Cl.
*H01L 21/302* (2006.01)
(52) U.S. Cl. .......... 438/692; 438/693; 216/89; 252/79.1
(58) Field of Classification Search .................. 438/692; 216/89; 252/79.1
See application file for complete search history.

(56) References Cited

U.S. PATENT DOCUMENTS

| 4,944,836 | A | 7/1990 | Beyer et al. | |
| 5,502,251 | A | 3/1996 | Pohmer et al. | |
| 6,001,730 | A | 12/1999 | Farkas et al. | |
| 6,022,400 | A | 2/2000 | Izumi et al. | |
| 6,046,110 | A | 4/2000 | Hirabayashi et al. | |
| 6,432,824 | B2 * | 8/2002 | Yanagisawa | 438/691 |
| 6,432,828 | B2 | 8/2002 | Kaufman et al. | |
| 6,547,843 | B2 | 4/2003 | Shimazu et al. | |
| 6,555,510 | B2 * | 4/2003 | Lamanna et al. | 510/175 |
| 6,720,264 | B2 | 4/2004 | Sahota et al. | |
| 2001/0039766 | A1 * | 11/2001 | Hattori et al. | 51/308 |
| 2006/0216939 | A1 | 9/2006 | Uchida et al. | |

FOREIGN PATENT DOCUMENTS

| EP | 0 371 147 A1 | 6/1990 |
| JP | 02-278822 A | 11/1990 |
| JP | 05-112775 A | 5/1993 |
| JP | 6-124946 A | 5/1994 |
| JP | 07-183288 A | 7/1995 |
| JP | 08-083780 A | 3/1996 |
| JP | 09-055363 A | 2/1997 |
| JP | 10-180937 A | 7/1998 |
| JP | 2819196 B2 | 8/1998 |
| JP | 10-270447 A | 10/1998 |
| JP | 11-033896 A | 2/1999 |
| JP | 2000-53946 A | 2/2000 |
| JP | 2000-144109 A | 5/2000 |
| JP | 2001-064631 A | 3/2001 |
| JP | 2001-135601 A | 5/2001 |
| JP | 2001-144060 A | 5/2001 |
| JP | 2001-189295 A | 7/2001 |
| JP | 2001-269859 A | 10/2001 |
| JP | 2001-269860 A | 10/2001 |
| JP | 2001-316691 A | 11/2001 |
| JP | 2002-121541 A | 4/2002 |
| JP | 2004-534396 A | 11/2004 |
| WO | WO 89/12082 A1 | 12/1989 |
| WO | WO 99/47618 A1 | 9/1999 |
| WO | WO 00/00561 A1 | 1/2000 |
| WO | WO 00/39844 A1 | 7/2000 |
| WO | 01/04226 A2 | 1/2001 |
| WO | 01/33620 A1 | 5/2001 |
| WO | WO 01/44402 A1 | 6/2001 |
| WO | WO 01/57919 A1 | 8/2001 |
| WO | 02/102910 A1 | 12/2002 |

OTHER PUBLICATIONS

Wijekoon et al. (Development of a production worthy copper CMP process;1998 IEEE Advanced Semiconductor Manufacturing Conference).*
Japanese Office Action dated Jan. 8, 2008 (mailing date), issued in corresponding Japanese Patent Application No. 2003-541040.
Kaufman F. B. et al., "Chemical-Mechanical Polishing for Fabricating Patterned W Metal Features as Chip Interconnects", Journal of Electrochemical Society, vol. 138, No. 11 (Nov. 1991) (The Electrochemical Society, Inc.), pp. 3460-3465.
Chinese Office Action dated Dec. 8, 2006, issued in corresponding Chinese Patent Application No. 028265513.
Japanese Office Action dated Sep. 25, 2007 (mailing date), issued in corresponding Japanese Patent Application No. 2003-541040.
Japanese Office Action dated Mar. 30, 2010, issued in corresponding Japanese Patent Application No. 2007-304888.
Japanese Office Action dated Dec. 15, 2010, issued in corresponding Japanese Patent Application No. 2010-14423.
Japanese Office Action dated Mar. 22, 2011, issuerd in corresponding Japanese Patent Application No. 2008-058740.
Japanese Office Action dated Jul. 26, 2011, issued in corresponding Japanese Patent Appplication No. 2007-304888.

* cited by examiner

*Primary Examiner* — Humera Sheikh
*Assistant Examiner* — Patricia George
(74) *Attorney, Agent, or Firm* — Westerman, Hattori, Daniels & Adrian, LLP

(57) ABSTRACT

The present invention relates to polishing slurry and polishing method used for polishing in a process for forming wirings of a semiconductor device, and the like. There are provided polishing slurry giving a polished surface having high flatness even if the polished surface is made of two or more substances, and further, capable of suppressing metal residue and scratches after polishing, and a method of chemical mechanical polishing using this. The polishing slurry of the present invention is polishing slurry containing at least one of a surfactant and an organic solvent, and a metal oxide dissolving agent and water, or polishing slurry containing water and abrasive, wherein the surface of the abrasive is modified with an alkyl group, and preferably, it further contains a metal oxidizer, water-soluble polymer, and metal inhibitor.

5 Claims, No Drawings

POLISHING SLURRY AND POLISHING METHOD

CROSS REFERENCE TO RELATED APPLICATION

This application is a divisional of application Ser. No. 10/493,867, filed Nov. 5, 2004, ABN Aug. 20, 2007, which is a National Stage entry under 35 U.S.C. section 371 of International Application No. PCT/JP02/11370 filed on Oct. 31, 2002, both of which are incorporated by reference in their entirety.

FIELD OF THE INVENTION

The present invention relates to polishing slurry and a polishing method used for polishing in a process of forming wiring of a semiconductor device, and the like.

BACKGROUND TECHNOLOGY

Recently, novel fine processing technologies are being developed with increase in the degree of integration and the performance of semiconductor integration circuits (hereinafter, referred to as LSI). Also a chemical mechanical polishing (hereinafter, referred to as CMP) method is one of these technologies, and is a technology frequently used in flattening of an interlayer insulating film, formation of a metal plug and formation of implanted wiring in an LSI production process, particularly, a multi-layer wiring formation process. This technology is disclosed, for example, in U.S. Pat. No. 4,944,836.

Recently, for increasing the performance of LSI, utilization of copper and copper alloy has been tried as a conductive substance of a wiring material. However, it is difficult to finely process copper and copper alloy by a conventional dry etching method frequently used in formation of aluminum alloy wiring. Therefore, there is mainly adopted what is called damascene method in which a thin film of copper or copper alloy is piled and implanted on an insulating film on which trenches have been previously formed, and the above-mentioned thin film on portions other than the trench portions is removed by CMP to form implanted wiring. This technology is disclosed in, for example, Japanese Patent Application Laid-Open (JP-A) No. H2-278822.

In a general metal CMP method of polishing a metal for wiring portions such as copper, copper alloy and the like, polishing cloth (pad) is pasted on a polishing plate (platen) in the form of disc, the surface of the substrate on which a metal film has been formed is pressed to the surface of the polishing cloth while wetting the surface of the polishing cloth with polishing slurry for metal, and the polishing plate is rotated under condition of given pressure applied to the metal film from the rear surface of the polishing cloth (hereinafter, referred to as polishing pressure), to remove the metal film at a convex part by relative mechanical friction between the polishing slurry and the convex part of the metal film.

Polishing slurry for metal used for CMP is in general composed of an oxidizer and abrasive, and if necessary, a metal oxide dissolving agent and a protective film formation agent are further added. It is believed a basic mechanism to first oxidize the surface of a metal film with an oxidizer, and scrape off its oxidized surface with abrasive. The oxidized layer on the metal surface at a concave portion does not contact significantly with a polishing pad and an effect of scraping off with abrasive is not exerted on the surface, consequently, the metal layer at a convex portion is removed with progress of CMP, leading to flattening of the surface of the substrate. The details of this are disclosed in Journal of Electrochemical Society, vol. 138, No. 11 (1991), pp. 3460 to 3464.

As a method of enhancing the polishing speed by CMP, it is the effective to add a metal oxide dissolving agent. The reason for this is interpreted that if particles of a metal oxide scraped off by abrasive are dissolved (hereinafter, referred to as etching), an effect of scraping off with abrasive increases. Though the polishing speed by CMP is improved by addition of a metal oxide dissolving agent, when, on the other hand, also an oxide layer on the surface of a metal film at a concave portion is etched to expose the surface of the metal film, the surface of the metal film is further oxidized with the oxidizer, and by repetition of this procedure, etching of the metal film at a concave portion progresses. Consequently, a phenomenon of formation of depression in the form of dish at the central portion of the surface of implanted metal wiring after polishing (hereinafter, referred to as dishing) occurs, deteriorating the flattening effect.

For preventing this, a protective film formation agent is further added. The protective film formation agent forms a protective film on an oxide layer of the surface of a metal film, and resultantly prevents dissolution of the oxide layer into polishing slurry. It is desired that this protective film can be easily scraped off by abrasive and does not decrease the polishing speed by CMP.

For suppressing corrosion during polishing and dishing of copper or copper alloy and for forming LSI wiring of high reliability, there is suggested a method of using polishing slurry for CMP containing BTA as a protective film formation agent and a metal oxide dissolving agent composed of amide sulfuric acid or aminoacetic acid such as glycine and the like. This technology is described, for example, in Japanese Patent Application Laid-open No. 8-83780.

In formation of metal implanting such as formation of damascene wirings of copper, copper alloy and the like and formation plug wirings of tungsten and the like, when the speed of polishing a silicon dioxide film which is an interlayer insulating film formed on parts other than the implanting formation parts is also large, thinning in which the thickness of wirings also including the interlayer insulating film decreases occurs. As a result, increase in wiring resistance occurs, therefore, a property is required in which the polishing speed of a silicon dioxide film is sufficiently small in comparison with the metal film to be polished. For suppressing the polishing speed of silicon dioxide by an anion generated by dissociation of an acid, there is suggested a method of increasing pH of polishing slurry more than pKa-0.5. This technology is described in, for example, Japanese Patent Publication No, 2819196.

On the other hand, as the lower layer of a metal for wiring part such as copper, copper alloy and the like, a conductor layer of, for example, a tantalum compound such as tantalum, tantalum alloy, tantalum nitride and the like is formed, as a barrier conductor layer for preventing diffusion of copper into an interlayer insulating film and improving close adherence with this (hereinafter, referred to as barrier layer). Therefore, on parts other than wiring parts of implanting copper or copper alloy, an exposed barrier layer should be removed by CMP. However, the conductor of this barrier layer has high hardness as compared with copper or copper alloy, consequently, sufficient polishing speed is not obtained and its flattening property deteriorates in may cases even if a polishing material for copper or copper alloy is combined. Therefore, a two-stage polishing method composed of a first process of polishing a metal for wiring and a second process of polishing a barrier layer is investigated.

In the second process of polishing a barrier layer of the above-mentioned two-stage polishing method, polishing of an interlayer insulating film, for example, silicon dioxide, or organosilicate glass using trimethylsilane as a starting material which is a Low-k (low permittivity) film, or whole aromatic ring-based Low-k film is required in some cases for flattening. In this case, there is mentioned a method of polishing while maintaining the flatness of the surface of a barrier layer, a metal for wiring and an interlayer insulating film by approximately equalizing the polishing speed of a barrier layer and metal for wiring part and the polishing speed of an interlayer insulating film so that the polished surface is flat when all of the interlayer insulating film is exposed.

For increasing the polishing speed of an interlayer insulating film corresponding to the polishing speed of a barrier layer and metal for wiring part, there is envisaged, for example, to increase the size of abrasives in polishing slurry for conductor of a barrier layer, however, there is a problem that scratch occurring on copper or copper alloy and an oxide film, causing a poor electric property. Such a poor electric property is generated also by poor washing after polishing by CMP. On the other hand, there is a problem of occurrence of a short-cut defect since the copper residue on high density wiring parts cannot be removed in a CMP process.

The present invention provides polishing slurry giving a polished surface having high flatness in view of the above-mentioned problems. Further, there is provided polishing slurry by which the polishing speed of an interlayer insulating film is as fast as the polishing speed of a barrier layer and a metal for wiring part. By this polishing slurry, the speed of polishing a wiring part can be controlled without decreasing the speed of polishing a barrier layer. Metal residue and scratches after polishing can be suppressed. Further, the present invention provides a polishing method in production of a semiconductor device excellent in fineness, film thinness, dimension precision and electric property, and having high reliability, and requiring low cost.

DISCLOSURE OF THE INVENTION

The present invention relates to (1) polishing slurry comprising a surfactant, metal oxide dissolving agent and water.

Further, the present invention relates to (2) polishing slurry comprising an organic solvent, metal oxide dissolving agent and water.

Still further, the present invention relates to the following polishing slurries.

(3) The polishing slurry according to the above-mentioned (1) or (2), comprising abrasive.

(4) The polishing slurry according to the above-mentioned (3), wherein the abrasive is at least one selected from silica, alumina, ceria, titania, zirconia and germania.

(5) The polishing slurry according to the above-mentioned (3) or (4), wherein the surface of the abrasive is modified with an alkyl group.

Further, the present invention relates to (6) Polishing slurry comprising abrasive and water, wherein the surface of the abrasive is modified with an alkyl group. Still further, the present invention relates to the following polishing slurries.

(7) The polishing slurry according to the above-mentioned (6), wherein the abrasive is at least one selected from silica, alumina, ceria, titania, zirconia and germania of which surface is modified with an alkyl group.

(8) The polishing slurry according to the above-mentioned (6) or (7), comprising a metal oxide dissolving agent.

(9) The polishing slurry according to any of the above-mentioned (6) to (8), comprising at least one of a surfactant and an organic solvent.

(10) The polishing slurry according to any of the above-mentioned (1) to (5), (8) and (9), wherein the metal oxide dissolving agent is at least one selected from organic acids, esters of organic acids, ammonium salts of organic acids and sulfuric acid.

(11) The polishing slurry according to any of the above-mentioned (2) to (5), (9) and (10), wherein the organic solvent is contained in a proportion of 0.1 to 95 wt %.

(12) The polishing slurry according to any of the above-mentioned (2) to (5), (9) to (11), wherein the organic solvent is at least one selected from glycols and derivatives thereof, alcohols and carbonic esters.

(13) The polishing slurry according to any of the above-mentioned (1), (3) to (5), (9) to (12), wherein the surfactant is at least one selected from nonionic surfactants and anionic surfactants.

(14) The polishing slurry according to any of the above-mentioned (1), (3) to (5), (9) to (13), wherein the surfactant is at least one selected from perfluoroalkanesulfonic acids and derivatives thereof.

(15) The polishing slurry according to any of the above-mentioned (1), (3) to (5), (9) to (14), wherein the surfactant is contained in a proportion of 0.00001 to 20 wt %.

(16) The polishing slurry according to any of the above-mentioned (1) to (15), comprising a metal oxidizer.

(17) The polishing slurry according to the above-mentioned (16), wherein the metal oxidizer is at least one selected from hydrogen peroxide, nitric acid, potassium periodate, hypochlorous acid and ozone water.

(18) The polishing slurry according to any of the above-mentioned (1) to (17), comprising a water-soluble polymer having a weight-average molecular weight of 500 or more.

(19) The polishing slurry according to the above-mentioned (18), wherein the above-mentioned water-soluble polymer is at least one selected from polysaccharides, polycarboxylic acids, polycarboxylic esters and salts thereof, and vinyl-based polymers.

The present invention relates to (20) A polishing method comprising a first polishing process of polishing a conductive substance layer of a substrate having an interlayer insulating film carrying a surface composed of a concave portion and a convex portion, a barrier conductor layer coating the above-mentioned interlayer insulating film along its surface and a conductive substance layer filling the above-mentioned concave portion to coat the barrier conductor layer, to expose the barrier conductor layer on the above-mentioned convex portion, and a second polishing process of chemical mechanical polishing at least the barrier conductor layer and the conductive substance layer on the concave portion while feeding the polishing slurry according to any of the above-mentioned (1) to (19) to expose the interlayer insulating film on the convex portion.

Further, the present invention relates to the following polishing methods.

(21) The polishing method according to the above-mentioned (20), wherein the above-mentioned interlayer insulating film is a silicon-based film or an organic polymer film.

(22) The polishing method according to the above-mentioned (20) or (21), wherein the conductive substance is mainly composed of copper.

(23) The polishing method according to any of the above-mentioned (20) to (22), wherein the barrier conductor layer is a barrier layer of preventing diffusion of the above-mentioned conductive substance into the above-mentioned interlayer insulating film, and comprises at least one selected from tantalum, tantalum nitride, tantalum alloy, other tantalum compounds, titanium, titanium nitride, titanium alloy, other titanium compounds, tungsten, tungsten nitride, tungsten alloy, and other tungsten compounds.

BEST MODES FOR CARRYING OUT THE INVENTION

The first feature of the polishing slurry of the present invention is comprising at least one of a surfactant and an organic solvent, and a metal oxide dissolving agent and water. Preferably, it contains further abrasives and a metal oxidizer. Further, it may also contain a water-soluble polymer, metal inhibitor and the like, if necessary.

Surfactants are classified, in general, into four kinds of agents of nonionic surfactants, anionic surfactants, cationic surfactants and ampholytic surfactants.

As the surfactant in the present invention, fluorine-based surfactants having a carbon-fluorine chain as a hydrophobic group can also be used. For example, perfluoroalkanesulfonic acids and derivatives thereof are exemplified. Preferable are perfluorooctanesulfonic acid and derivatives thereof. Also fluorine-based surfactants are classified in four kinds of agents as described above.

Examples of the nonionic surfactant include polyoxyethylene alkyl ethers, polyoxyethylene alkylphenyl ethers, polyoxyethylenepropyl perfluorooctanesulfoneamide, polyoxyethylene-polyoxypropylene block polymer, polyoxyethylene glycerin fatty esters, polyoxyethylene hardened castor oil, polyethylene glycol fatty esters, propyl-2-hydroxyethyl perfluorooctanesulfoneamide, sorbitan fatty esters, glycerin fatty esters, sucrose fatty esters, fatty alkanol amides, polyoxyethylenealkylamines and derivatives thereof. Also, glycols such as acetylene diol and ethylene oxide adducts thereof, and the like are listed. The above-mentioned term "polyoxyethylene" means inclusion of not only those having a number (n) of ethylene oxide added of 2 or more but also those having one ethylene oxide added.

Examples of the anionic surfactant include salts of alkylbenzensulfonic acid, perfluorooctanesulfonic acid, bis[2-(N-propyl perfluorooctanesulfonylamino)ethyl] phosphate, salts of alkylsulfosuccinates, salts of alkylsulfonic acids, salts of alkyl ether carboxylic acids, salts of alcohol sulfates, salts of alkyl ether sulfates, salts of alkylphosphates, and derivatives thereof.

Examples of the cationic surfactant include salts of aliphatic alkylamines, aliphatic quaternary ammonium salts and the like, and examples of the ampholytic surfactant include salts of aminocarboxylic acids and the like.

These surfactants can be used singly or in combination of two or more.

As the surfactant in the polishing slurry of the present invention, preferable are nonionic surfactants and anionic surfactants, and particularly, those containing no alkali metal are preferable.

Further preferable is at least one selected from polyethylene glycol type nonionic surfactants, polyoxyethylene alkyl ethers, polyoxyethylene alkylphenyl ethers, polyoxyethylenepropyl perfluorooctanesulfoneamide, glycols, glycerin fatty esters, sorbitan fatty esters, fatty alkanolamides, salts of alcohol sulfates, salts of alkyl ether sulfates, salts of alkylbenzenesulfonic acids, and salts of alkylphosphates.

Examples of the polyethylene glycol type nonionic surfactant include polyethylene glycol fatty esters such as polyethylene glycol monolaurate, polyethylene glycolmonostearate, polyethylene glycol distearate, polyethylene glycol monooleate and the like.

The organic solvent contained in the polishing slurry of the present invention is not particularly restricted, and preferable are those which can be mixed with water at any ratio.

Examples thereof include carbonic esters such as ethylene carbonate, propylene carbonate, dimethyl carbonate, diethyl carbonate, methyl ethyl carbonate and the like; lactones such as butyrolactone, propylolactone and the like; glycols such as ethylene glycol, propylene glycol, diethylene glycol, dipropylene glycol, triethylene glocyl, tripropylene glycol and the like; derivatives of glycols such as glycol mono-ethers such as ethylene glycol monomethyl ether, propylene glycol monomethyl ether, diethylene glycol monomethyl ether, dipropylene glycol monomethyl ether, triethylene glycol monomethyl ether, tripropylene glycol monomethyl ether, ethylene glycol monoethyl ether, propylene glycol monoethyl ether, diethylene glycol monoethyl ether, dipropylene glycol monoethyl ether, triethylene glycol monoethyl ether, tripropylene glycol monoethyl ether, ethylene glycol monopropyl ether, propylene glycol monopropyl ether, diethylene glycol monopropyl ether, dipropylene glycol monopropyl ether, triethylene glycol monopropyl ether, tripropylene glycol monopropyl ether, ethylene glycol monobutyl ether, propylene glycol monobutyl ether, diethylene glycol monobutyl ether, dipropylene glycol monobutyl ether, triethylene glycol monobutyl ether, tripropylene glycol monobutyl ether and the like, and glycol di-ethers such as ethylene glycol dimethyl ether, propylene glycol dimethyl ether, diethylene glycol dimethyl ether, dipropylene glycol dimethyl ether, triethylene glycol dimethyl ether, tripropylene glycol dimethyl ether, ethylene glycol diethyl ether, propylene glycol diethyl ether, diethylene glycol diethyl ether, dipropylene glycol diethyl ether, triethylene glycol diethyl ether, tripropylene glycol diethyl ether, ethylene glycol dipropyl ether, propylene glycol dipropyl ether, diethylene glycol dipropyl ether, dipropylene glycol dipropyl ether, triethylene glycol dipropyl ether, tripropylene glycol dipropyl ether, ethylene glycol dibutyl ether, propylene glycol dibutyl ether, diethylene glycol dibutyl ether, dipropylene glycol dibutyl ether, triethylene glycol dibutyl ether, tripropylene glycol dibutyl ether and the like; ethers such as tetrahydrofuran, dioxane, dimethoxyethane, polyethylene oxide, ethylene glycol monomethyl acetate, diethylene glycol monoethyl ether acetate, propylene glycol monomethyl ether acetate and the like; alcohols such as methanol, ethanol, propanol, n-butanol, n-pentanol, n-hexanol, isopropanol and the like; ketones such as acetone, methyl ethyl ketone; other phenols, dimethylformamide, n-methylpyrrolidone, ethyl acetate, ethyl lactate, sulfolane and the like.

The preferable organic solvent is at least one selected from glycols and derivatives thereof, alcohols, and carbonic esters.

The second feature of the polishing slurry of the present invention is comprised of water and abrasives of which surface is modified with an alkyl group. Preferably, it further contains a metal oxide dissolving agent, metal oxidizer, organic solvent and surfactant, if necessary. Further, polymers and metal inhibitors may also be contained, if necessary.

As the abrasive in the present invention, any of inorganic particles of silica, alumina, zirconia, ceria, titania, germania, silicon carbide and the like and organic particles of polystyrene, polyacryl, polyvinyl chloride and the like may be used. Of them, silica, alumina, zirconia, ceria, titania and germania are preferable, and particularly, colloidal silica and colloidal alumina showing excellent dispersion stability in polishing slurry, producing a small number of generation of polishing flaws (scratches) generated by CMP, and having an average particle size of 70 nm or less are preferable, and colloidal silica and colloidal alumina having an average particle size of 40 nm or less are more preferable. The particle size can be measured, for example, by an optical diffraction scattering type particle size distribution meter (for example, COULTER N4 SD manufactured by COULTER Electronics). Particles obtained by coagulation of less than 2 on average of primary particles are preferable, and particles obtained by coagulation of less than 1.2 on average of primary particles are more preferable. Further, the standard deviation of average particle size distribution is preferably 10 nm or less, and the standard deviation of average particle size distribution is more preferably 5 nm or less. These can be used singly or in combination of two or more.

As the abrasive of which surface is modified with an alkyl group in the second feature of the present invention, the above-mentioned inorganic particles or the above-mentioned organic particles of which surface is modified with an alkyl group are listed. Any of the inorganic particles and organic particles may be used, of them, preferable particles are also as described above. The modified particles can be used singly or in admixture of two or more.

The method of modifying the surface of an abrasive with an alkyl group is not particularly restricted, and there is mentioned a method of reacting a hydroxyl group present on the surface of an abrasive with alkoxysilane having alkyl group. The alkoxysilane having alkyl group is not particularly restricted and listed are monomethyltrimethoxysilane, dimethyldimethoxysilane, trimethylmonomethoxysilane, monoethyltrimethoxysilane, diethyldimethoxysilane, triethylmonomethoxysilane, monomethyltriethoxysilane, dimethyldiethoxysilane and trimethylmonoethoxysilane. The reaction method is not particularly restricted and for example, abrasive and alkoxysilane react at room temperature in polishing slurry, and they may also be heated for promoting the reaction.

For obtaining colloidal silica, production methods by hydrolysis of a silicon alkoxide or ion exchange of sodium silicate are known, and for obtaining colloidal alumina, production methods by hydrolysis of aluminum nitrate are known. Regarding the colloidal silica, those obtained by production methods by hydrolysis of a silicon alkoxide are most frequently utilized from the standpoint of control of particle size and alkali metal impurity. As the silicon alkoxide, TEMS (tetramethoxysilane) or TEOS (tetraethoxysilane) is generally used. As the parameter affecting particle size in the method of hydrolysis in an alcohol solvent, there are mentioned the concentration of a silicon alkoxide, the concentration of ammonia used as a catalyst and pH, reaction temperature, the kind (molecular weight) of the alcohol solvent, reaction time, and the like. By controlling these parameters, colloidal silica dispersed liquid of given particle size and degree of coagulation can be obtained.

The metal oxide dissolving agent in the present invention is not particularly restricted, and examples thereof include organic acids such as formic acid, acetic acid, propionic acid, butyric acid, valeric acid, 2-methylbutyric acid, n-hexanoic acid, 3, 3-dimethylbutyric acid, 2-ethylbutyric acid, 4-methylpentanoic acid, n-heptanoic acid, 2-methylhexanoic acid, n-octanoic acid, 2-ethylhexanoic acid, benzoic acid, glycolic acid, salicylic acid, glyceric acid, oxalic acid, malonic acid, succinic acid, glutaric acid, adipic acid, pimelic acid, maleic acid, phthalic acid, malic acid, tartaric acid, citric acid, p-toluenesulfonic acid and the like, esters of these organic acids and ammonium salts of these organic acids, and the like. Further, inorganic acids such as hydrochloric acid, sulfuric acid, nitric acid and the like, and ammonium salts of these inorganic acids, for example, ammonium persulfate, ammonium nitrate, ammonium chloride, chromic acid and the like are listed. Of them, formic acid, malonic acid, malic acid, tartaric acid and citric acid are suitable from the standpoint of efficient control of etching speed, while maintaining practical CMP speed and sulfuric acid is suitable from the standpoint of high CMP speed, for a conductive substance mainly composed of metals. These can be used singly or in admixture of two or more.

A metal oxidized may be added to the polishing slurry of the present invention. As the metal oxidizer, hydrogen peroxide, nitric acid, potassium periodate, hypochlorous acid, ozone water and the like are listed, and of them, hydrogen peroxide is particularly preferable. These can be used singly or in admixture of two or more. When the substrate is a silicon base plate or the like containing an element for integrated circuit, oxidizers containing no non-volatile components are desirable since pollution with alkali metals, alkaline earth metals, halide and the like is not desirable. Since ozone water shows remarkable change in composition by time, hydrogen peroxide is most suitable. When the substrate which is an application subject is a glass base plate containing no semiconductor element, or the like, oxidizers containing non-volatile components may be permissible.

A water-soluble polymer may be added to the polishing slurry of the present invention. The weight-average molecular weight of the water-soluble polymer is preferably 500 or more, more preferably 1500 or more, and particularly preferably 5000 or more. The upper limit of the weight-average molecular weight is not particularly restricted, and it is preferably 5000000 or less from the standpoint of solubility. When the weight-average molecular weight is less than 500, there is a tendency that high polishing speed is not manifested.

The weight-average molecular weight can be measured using a calibration curve of standard polystyrene by gel permeation chromatography.

The water-soluble polymer having a weight-average molecular weight of 500 or more is not particularly restricted, and examples thereof include polysaccharides such as alginic acid, pectic acid, carboxymethylcellulose, agar, curdlan, Pullulan and the like; polycarboxylic acids, esters thereof and salts thereof, such as polyaspartic acid, polyglutamic acid, polylysine, polymalic acid, polymethacrylic acid, polyammonium methacrylate, polysodium methacrylate, polyamic acids, polymaleic acid, polyitaconic acid, polyfumaric acid, poly(p-styrenecarboxylic acid), polyacrylic acid, polyacrylamide, aminopolyacrylamide, polyammonium acrylate, polysodium acrylate, polyamic acid, polyammonium amidate, polysodium amidate, polyglyoxylic acid and the like; vinyl-based polymers such as polyvinyl alcohol, polyvinylpyrrolidone, polyacrolein and the like; polyethylene glycol and the like. These can be used singly or in admixture of two or more. When the substrate applied is a silicon base plate or the like for semiconductor integrated circuit, acids or its ammonium salts are desirable since pollution with alkali metals, alkaline earth metals, halide and the like is not desirable. When the substrate is a glass base plate or the like, this is not the case. Of them, preferable are pectinic acid, agar, polymalic acid, polymethacrylic acid, ammonium polyacrylate, polyacrylamide, polyvinyl alcohol and polyvinylpyrrolidone, esters thereof and ammonium salts thereof.

A metal inhibitor may be added to the polishing slurry of the present invention. As the metal inhibitor, there are listed, for example, 2-mercaptobenzothiazole, 1,2,3-triazole, 1,2,4-triazole, 3-amino-1H-1,2,4-triazole, benzotriazole, 1-hydroxybenzotriazole, 1-dihydroxypropylbenzotriazole, 2,3- dicarboxypropylbenzotriazole, 4-hydroxybenzotriazole, 4-carboxyl(-1H-)benzotriazole, 4-carboxyl(-1H-)benzotriazole methyl ester, 4-carboxyl(-1H-)benzotriazole butyl ester, 4-carboxyl(-1H-)benzotriazole octyl ester, 5-hexybenzotriazole, [1,2,3-benzotriazolyl-1-methyl][1,2,4-triazolyl-1-methyl][2-ethylhexyl]amine, tolyltriazole, naphthotriazole, bis[(1-benzotriazolyl)methyl]phosphonic acid and the like.

Further listed are pyrimidine, 1,2,4-triazolo[1,5-a]pyrimidine, 1,3,4,6,7,8-hexahydro-2H-pyrimide[1,2-a]pyrimidine, 1,3-diphenyl-pyrimidine-2,4,6-trione, 1,4,5,6-tetrahydropyrimidine, 2,4,5,6-tetraaminopyrimidine sulfate, 2,4,5-trihydroxypyrimidine, 2,4,6-triaminopyrimidine, 2,4,6-trichloropyrimidine, 2,4,6-trimethoxypyrimidine, 2,4,6-triphenylpyrimidine, 2,4-diamino-6-hydroxylpyrimidine, 2,4-diaminopyrimidine, 2-acetoamidepyrimidine, 2-aminopyrimidine, 2-methyl-5,7-diphenyl-(1,2,4)triazole(1,5-a)pyrimidine, 2-methylsulfanyl-5,7-diphenyl-(1,2,4)-triazolo(1,5-a)pydimidine, 2-methylsulfanyl-5,7-diphenyl-4,7-dihydro-(1,2,4)triazolo(1,5-a)pyrimidine, 4-aminopyrazolo[3,4-d]pyrimidine and the like having a pyrimidine constitution. These can be used singlyorin admixture of two or more.

The compounding amount in the case of compounding of a surfactant into the polishing slurry of the present invention is preferably from 0.00001 to 20 wt % in the polishing slurry from the standpoints of dispersion and prevention of deposition, further, scratch. Namely, it is preferably from 0.00001 to 20 g, more preferably from 0.0001 to 10 g, and particularly preferably from 0.0001 to 5 g based on 100 g of the total amount of the polishing slurry. When the compounding amount is less than 0.00001 g, wet-ability of the polishing slurry for the polishing surface of a substrate is low, and when more than 20 g, polishing speed tends to lower.

The compounding amount in the case of compounding an organic solvent in the polishing slurry of the present invention is preferably from 0.1 to 95 wt % in the polishing slurry. Namely, it is preferably from 0.1 to 95 g, more preferably from 0.2 to 50 g, and particularly preferably from 0.5 to 10 g, based on 100 g of the total amount of the polishing slurry. When the compounding amount is less than 0.1 g, sufficient polishing speed is not obtained due to low wet-ability of the polishing slurry for a substrate, and when over 95 g, the solubility of a polishing slurry component deteriorates, undesirably.

The compounding amount in the case of compounding of a metal oxide dissolving agent in the polishing slurry of the present invention is preferably from 0.001 to 20 g, more preferably from 0.002 to 10 g, and particularly preferably from 0.005 to 5 g, based on 100 g of the total amount of a surfactant, organic solvent, metal oxide dissolving agent, water, abrasives, metal oxidizer and water-soluble polymer (hereinafter, referred to as seven components) in the polishing slurry. When the compounding amount is less than 0.001 g, polishing speed is low, and when over 20 g, control of etching is difficult and roughening tends to occur on the polished surface.

Of the above-mentioned seven components, the compounding amount of water maybe the remaining part and is not particularly restricted providing water is contained.

The compounding amount of abrasives in the case of compounding of abrasives in the polishing slurry of the present invention is preferably from 0.01 to 50 g, more preferably from 0.02 to 40 g, and particularly preferably from 0.05 to 30 g based on 100 g of the total amount of seven components. When the compounding amount is less than 0.01 g, polishing speed is slow, and when over 50 g, there is a tendency of occurrence of a lot of scratches.

The compounding amount in the case of compounding of a metal oxidizer in the polishing slurry of the present invention is preferably from 0 to 50 g, more preferably from 0 to 20 g, and particularly preferably from 0 to 10 g based on 100 g of the total amount of seven components. When the compounding amount is over 50 g, there is a tendency of occurrence of roughening on the polished surface.

The compounding amount in the case of compounding of a water-soluble polymer in the polishing slurry of the present invention is preferably from 0 to 10 g, more preferably from 0 to 5 g, and particularly preferably from 0 to 2 g based on 100 g of the total amount of seven components. When the compounding amount is over 10 g, there is a tendency of lowering of polishing speed.

The compounding amount in the case of compounding of a metal inhibitor in the polishing slurry of the present invention is preferably from 0 to 10 g, more preferably from 0 to 5 g, and particularly preferably from 0 to 2 g based on 100 g of the total amount of seven components. When the compounding amount is over 10 g, there is a tendency of lowering of polishing speed.

The polishing slurry of the present invention may contain coloring agents such as dyes such as Victoria Pure Blue and the like, pigments such as Phthalocyanine Green and the like, in addition to the above-mentioned various components.

The polishing slurry of the present invention as described above can be used for chemical mechanical polishing (CMP) of a conductive substance layer, barrier layer and interlayer insulating film of a semiconductordevice. It is preferable that conductive substance layer/barrier layer/interlayer insulating films are polished at a polishing speed ratio of 1/0.01 to 20/0.01 to 20 in CMP under the same conditions. It is more preferably 1/0.05 to 10/0.05 to 10, further preferably 1/0.1 to 10/0.01 to 10.

As the conductive substance, there are listed substances mainly composed of metals such as copper, copper alloy, copper oxide, copper oxide alloy, tungsten, tungsten alloy, silver, gold and the like, and preferable are conductive substance mainly composed of copper such as copper, copper alloy, copper oxide, copper alloy oxide and the like. As the conductive substance layer, films formed of the above-mentioned substances by a known sputtering method or plating method can be used.

As the interlayer insulating film, silicon-based film s and organic polymer films are listed. As the silicon-based film, listed are silica-based film s such as silicon dioxide, fluorosilicate glass, organosilicate glass, silicon oxynitride, silsesquioxane hydride and the like, silicon carbide and silicon nitride. As the organic polymer film, a whole aromatic low permittivity interlayer insulating films are mentioned. In particular, organosilicate glass is preferable. These films are formed by a CVD method, spin coat method, dip coat method or spray method.

The barrier layer is formed to prevent of diffusion of a conductive substance in an insulating film, and to improve close adherence of an insulating film and a conductive substance. It is preferable that a conductor used in a barrier layer contains one or more selected from tungsten, tungsten nitride, tungsten alloy, other tungsten compounds, titanium, titanium nitride, titanium alloy, other titanium compounds, tantalum, tantalum nitride, tantalum alloy and other tantalum compounds. The barrier layer may be a single layer composed of one compound or a laminated film composed of two or more compounds.

The polishing method of the present invention comprises a first polishing process of polishing a conductive substance layer of a substrate having an interlayer insulating film carrying a surface composed of a concave portion and a convex portion, a barrier layer coating the above-mentioned interlayer insulating film along its surface and a conductive substance layer filling the above-mentioned concave portion to coat the barrier layer, to expose the barrier layer on the above-mentioned convex portion, and a second polishing process of chemical and mechanical polishing at least the barrier layer and the conductive substance layer on the concave portion while feeding the above-mentioned polishing slurry of the present invention to expose the interlayer insulating film on the convex portion.

Here, for chemical mechanical polishing, a method is mentioned in which a polishing plate and a substrate are moved relatively while feeding polishing slurry under condition of pressing the substrate having a polishing surface onto polishing cloth (pad) of the polishing plate, to polish the polishing surface. For exposing an interlayer insulating film, a method of contacting a brush made of a metal or resin and a method of blowing polishing slurry at given pressure are mentioned, additionally.

As the apparatus used for polishing, there can be used a general polishing apparatus having a holder capable of retaining a substrate to be polished and having a polishing plate connected to a motor capable of changing its rotation, and the like, to which polishing clothe is pasted, in the case, for example, of polishing with polishing cloth. The polishing cloth is not particularly restricted, and general non-woven fabric, foamed polyurethane, porous fluorine resins and the like can be used. The polishing conditions are not restricted, however, the rotation speed of a polishing plate is preferably a low rotation of 200 rpm or less so that a substrate does not jump. The pressure of pressing a substrate having a polishing surface onto polishing cloth is preferably from 1 to 100 kPa, and for satisfying uniformity of CMP speed in wafer plane and flatness of pattern, it is more preferably from 5 to 50 kPa. During polishing, polishing slurry is continuously fed to polishing cloth by a pump and the like. Though the feeding amount is not particularly restricted, it is preferable that the surface of polishing cloth is always covered with polishing slurry. It is preferable that a substrate after completion of polishing is washed thoroughly in flowing water, then, water drops adhered on the substrate are removed by spin dry and the like, before drying this.

For conducting chemical mechanical polishing while making the surface condition of polishing cloth always constant, it is preferable to provide a process of conditioning of polishing cloth before polishing. For example, conditioning of polishing cloth is conducted with liquid containing at least water using a dresser with diamond particles. Subsequently, the chemical mechanical polishing process according to the present invention is performed, further, a substrate washing process is added, preferably.

The polishing method of the present invention can be applied, for example, to formation of a wiring layer in a semiconductor device. Hereinafter, an embodiment of the polishing method of the present invention will be illustrated along formation of a wiring layer in a semiconductor device.

First, an interlayer insulating film of silicon dioxide and the like is formed on a substrate made of silicon. Then, a concave portion (substrate exposed portion) of given pattern is formed on the surface of the interlayer insulating film by known means such as forming a resist layer, etching and the like, to give the interlayer insulating film having a convex portion and concave portion. On this interlayer insulating film, a barrier layer of tantalum and the like coating the interlayer insulating film along the convexoconcave on the surface is formed by vapor deposition or CVD and the like. Further, a metal conductive substance layer made of copper and the like coating the barrier layer so as to fill the above-mentioned convexoconcave is formed by vapor deposition, plating or CVD and the like. The thickness of formation of the interlayer insulating film, barrier layer and conductive substance are preferably about 0.01 to 2.0 μm, about 1 to 100 nm and about 0.01 to 2.5 μm, respectively.

Next, this conductive substance layer on the surface of a semiconductor substrate is polished by CMP using, for example, a polishing slurry for conductive substance showing sufficiently large above-mentioned polishing speed ratio of conductive substance/barrier layer (first polishing process). By this, the barrier layer at the convex portion on the substrate is exposed on the surface, to obtain a given conductor pattern having the conductive substance film remaining on the concave portion. The resulted pattern surface can be polished as a polishing surface for the second polishing process in the polishing method of the present invention using the polishing slurry of the present invention.

In the second polishing process, at least the above-mentioned exposed barrier layer and the conductive substance at the concave portion are polished by chemical mechanical polishing using the polishing slurry of the present invention capable of polishing a conductive substance, barrier layer and interlayer insulating film. All of the interlayer insulating film below the barrier layer at the convex portion is exposed, the conductive substance layer becoming a wiring layer remains at the concave portion, to obtain a given pattern in which the section of the barrier layer is exposed to the boundary between the convex portion and the concave portion. Polishing is completed at this stage. Further, for securing excellent flatness in completion of polishing, polishing may be conducted to depth involving a part of the interlayer insulating film at the convex portion by over polishing (for example, when time until obtaining a given pattern in the second polishing process is 100 seconds, polishing for additional 50 seconds in addition to this polishing for 100 seconds is called over polishing 50%).

On thus formed metal wirings, an interlayer insulating film and a second layer, metal wirings are formed, and an interlayer insulating film is again formed between the wirings and on the wirings, then, polishing is effected to give a smooth surface over the whole surface of a semiconductor substrate. This process is repeated given times, a semiconductor device having given number of wiring layers can be produced.

The polishing slurry of the present invention can be used not only for polishing of a silicon compound film formed on a semiconductor substrate as described above, but also for polishing of a silicon oxide film formed on a wiring board having given wirings, an inorganic insulating film of glass, silicon nitride and the like, optical glass such as photomask, lens, prism and the like, an inorganic conductive film such as ITO and the like, photo-integrated circuit, photo-switching element and photo-wave guiding route constituted of glass and crystalline materials, the end surface of optical fiber, an optical single crystal of a scintillator and the like, a solid laser single crystal, a LED sapphire substrate for blue laser, a semiconductor single crystal of SiC, GaP, GaAs and the like, a glass base plate for magnetic disk, a substrate of a magnetic head and the like.

EXAMPLES

The present invention will be illustrated further in detail by examples, however, the scope of the invention is not limited to these examples unless deviating from the technological idea of the present invention. For example, the kind and compounding ratio of materials of polishing slurry may be those other than the kinds and ratios described in the present examples, and also the composition and constitution of the polishing subject may be those other than compositions and constitutions described in the present examples.

(Polishing Slurry Production Method)

Materials shown in Tables 1 to 5 were mixed at respective compositions to prepare polishing slurries used in Examples 1 to 27 and Comparative Examples 1 to 4. Acetylene diol was used as glycols, and sodium dodecylbenzenesulfonate was used as a salt of an alkylbenzensulfonic acid, in Tables 3 and 4.

TABLE 1

| Material (parts by weight) | | Example 1 | Example 2 | Example 3 | Example 4 | Example 5 | Example 6 | Example 7 |
|---|---|---|---|---|---|---|---|---|
| Organic solvent | Ethanol | 10 | — | — | — | — | — | — |
| | Isopropyl alcohol | — | 10 | — | — | — | — | — |
| | Propylene glycol monomethyl ether | — | — | 10 | — | — | — | — |
| | Propylene glycol | — | — | — | 10 | — | — | — |
| | Dipropylene glycol monomethyl ether | — | — | — | — | 10 | — | — |
| | Ethylene glycol monomethyl ether | — | — | — | — | — | 10 | — |
| | Propylene carbonate | — | — | — | — | — | — | 10 |
| Metal oxide dissolving agent | Malonic acid | 0.5 | — | 0.5 | — | 0.5 | 0.5 | — |
| | Malic acid | — | 0.5 | — | 0.5 | — | — | 0.5 |
| Abrasive: colloidal silica | Average particle size of 20 nm | — | — | — | 2 | — | — | — |
| | Average particle size of 50 nm | 6 | 5 | 3 | — | 3 | 3 | 3 |
| Oxidizer | Hydrogen peroxide | 0.5 | 0.5 | 0.5 | 0.5 | 0.5 | 0.5 | 0.5 |
| Metal inhibitor | Benzotriazole | 0.1 | 0.1 | 0.1 | 0.1 | 0.1 | 0.1 | 0.1 |
| Polymer | Polyacrylic acid (‡) | — | — | — | — | — | — | — |
| Water | | 90 | 90 | 90 | 90 | 90 | 90 | 90 |

(* Weight-average molecular weight: 25000)

TABLE 2

| Material (parts by weight) | | Example 8 | Example 9 | Example 10 | Example 11 | Example 12 | Comparative Example 1 | Comparative Example 2 |
|---|---|---|---|---|---|---|---|---|
| Organic solvent | Ethanol | — | — | — | — | — | — | — |
| | Isopropyl alcohol | 10 | — | — | — | — | — | — |
| | Propylene glycol monomethyl ether | — | 10 | — | — | — | — | — |
| | Propylene glycol monopropyl ether | — | — | 10 | — | — | — | — |
| | Dipropylene glycol monomethyl ether | — | — | — | 10 | — | — | — |
| | Ethylene glycol monomethyl ether | — | — | — | — | 10 | — | — |
| | Propylene carbonate | — | — | — | — | — | — | — |
| Metal oxide dissolving agent | Malonic acid | 0.5 | 0.5 | — | — | 0.5 | 0.5 | — |
| | Malic acid | — | — | 0.5 | 0.5 | — | — | 0.5 |

TABLE 2-continued

| Material (parts by weight) | | Example 8 | Example 9 | Example 10 | Example 11 | Example 12 | Comparative Example 1 | Comparative Example 2 |
|---|---|---|---|---|---|---|---|---|
| Abrasive: colloidal silica | Average particle size of 20 nm | — | 4 | — | 3 | — | — | — |
| | Average particle size of 50 nm | — | — | 5 | 4 | 5 | 5 | 5 |
| Oxidizer | Hydrogen peroxide | — | — | 1 | 1 | 1 | 1 | 1 |
| Metal inhibitor | Benzotriazole | — | — | — | 0.1 | 0.1 | 0.1 | 0.1 |
| Polymer | Polyacrylic acid (‡) | — | — | — | — | 0.1 | — | — |
| Water | | 90 | 90 | 90 | 90 | 90 | 100 | 100 |

(* Weight-average molecular weight: 25000)

TABLE 3

| Material (parts by weight) | | Example 13 | Example 14 | Example 15 | Example 16 | Example 17 |
|---|---|---|---|---|---|---|
| Surfactant | Glycols | 0.1 | 0.2 | — | — | — |
| | Salts of alkylbenzene sulfonic acid | — | — | 0.1 | 1 | — |
| | Poly(n = 3)oxyethylenepropyl-perfluorooctanesulfoneamide | — | — | — | — | — |
| | p-nonylphenol monoethoxylate | — | — | — | — | 0.1 |
| Metal oxide dissolving agent | Malonic acid | 0.5 | 0.5 | — | — | 0.5 |
| | Malic acid | — | — | 0.5 | 0.5 | — |
| Abrasive: colloidal silica | Average particle size of 20 nm | — | — | 7 | 7 | — |
| | Average particle size of 50 nm | 5 | 5 | — | — | 3 |
| Oxidizer | Hydrogen peroxide | 1 | 1 | 1 | 1 | 1 |
| inhibitor | Benzotriazole | 0.1 | 0.1 | 0.1 | 0.1 | 0.1 |
| Polymer | Polyacrylic acid (‡) | — | — | — | — | — |
| Water | | 93.3 | 93.2 | 91.3 | 90.4 | 95.3 |

(* Weight-average molecular weight: 25000)

TABLE 4

| Material (parts by weight) | | Example 18 | Example 19 | Comparative Example 3 | Comparative Example 4 |
|---|---|---|---|---|---|
| Surfactant | Glycols | — | — | — | — |
| | Salts of alkylbenzene sulfonic acid | — | — | — | — |
| | Poly(n = 3)oxyethylenepropyl-perfluorooctanesulfoneamide | — | 0.005 | — | — |
| | p-nonylphenol monoethoxylate | 1 | — | — | — |
| Metal oxide dissolving agent | Malonic acid | 0.5 | 0.5 | 0.5 | — |
| | Malic acid | — | — | — | 0.5 |
| Abrasive: colloidal silica | Average particle size of 20 nm | — | — | — | — |
| | Average particle size of 50 nm | 3 | 5 | 5 | 5 |

TABLE 4-continued

| Material (parts by weight) | | Example 18 | Example 19 | Comparative Example 3 | Comparative Example 4 |
|---|---|---|---|---|---|
| Oxidizer | Hydrogen peroxide | 1 | 1 | 1 | 1 |
| inhibitor | Benzotriazole | 0.1 | 0.1 | 0.1 | 0.1 |
| Polymer | Polyacrylic acid (‡) | — | — | — | — |
| Water | | 94.4 | 93.35 | 93.4 | 93.4 |

(* Weight-average molecular weight: 25000)

TABLE 5

| Material (parts by weight) | | Example 20 | Example 21 | Example 22 | Example 23 | Example 24 | Example 25 | Example 26 | Example 27 |
|---|---|---|---|---|---|---|---|---|---|
| Organic solvent | Isopropyl alcohol | 10 | — | — | — | 10 | 10 | — | — |
| | Propylene glycol monomethyl ether | — | 10 | — | — | — | — | — | — |
| | Propylene glycol monopropyl ether | — | — | 10 | — | — | — | — | — |
| Metal oxide dissolving agent | Malonic acid | 0.5 | — | 0.5 | — | 0.5 | 0.5 | — | — |
| | Malic acid | — | 0.5 | — | 0.5 | — | — | 0.5 | 0.5 |
| Abrasive: colloidal silica | average particle size of 20 nm | — | — | — | 2 | — | — | — | — |
| | average particle size of 50 nm | 6 | 5 | 3 | — | 3 | 3 | 3 | 4 |
| Alkoxy silane having alkyl group | Trimethyl monomethoxy silane | 0.1 | 0.1 | 0.1 | 0.1 | — | — | — | 0.1 |
| | Dimethyl Dimethoxy silane | — | — | — | — | 0.1 | 0.1 | 0.1 | — |
| Oxidizer | Hydrogen peroxide | 0.5 | 0.5 | 0.5 | 0.5 | 0.5 | 0.5 | 0.5 | 0.5 |
| Metal inhibitor | Benzotriazole | 0.1 | 0.1 | 0.1 | 0.1 | 0.1 | — | — | — |
| Polymer | Polyacrylic acid (‡) | — | — | — | — | — | — | 0.1 | — |
| Water | | 90 | 90 | 90 | 100 | 90 | 90 | 100 | 95 |

(* Weight-average molecular weight: 25000)

(Substrate)

The following substrates were prepared.

Blandet substrate (a): Silicon base plate formed of organosilicate glass (thickness: 1000 nm) by a CVD method.

Blanket substrate (b): Silicon base plate formed of silicon dioxide having a thickness of 1000 nm by a CVD method.

Blanket substrate (c): Silicon base plate formed of a tantalum film having a thickness of 200 nm by a sputtering method.

Blanket substrate (d): Silicon base plate formed of a copper film having a thickness of 1600 nm by a sputtering method.

Production of pattern substrate (a): A organosilicate glass as described above (thickness: 1000 nm) was formed as an interlayer insulating film on a silicon base plate by a CVD method. On this organosilicate glass, trenches having a depth of 800 nm were formed by a photolithography method so that wiring metal parts having a width of 4.5 μm and interlayer insulating film parts having a width of 0.5 μm were mutually arranged, to produce stripe pattern parts (for evaluation of erosion) composed of concave portions (trenches portions) and convex portions (non-trench portions) on the surface.

Separately, trenches having a depth of 800 nm were likewise formed so that wiring metal parts having a width of 100 μm and interlayer insulating film parts having a width of 100 μm were mutually arranged, to produce stripe pattern parts (for evaluation of dishing) on the surface.

Further, along this surface, a tantalum film having a thickness of 200 nm was formed as a barrier layer by a sputtering method. On the above-mentioned tantalum film, a copper film of 1.6 μm was formed as a conductive substance layer so as to fill all of the above-mentioned trenches by a sputtering method. The projected copper film was polished until all of the barrier layer at the convex portions was exposed on the polishing surface, by CMP of high selectivity of polishing only copper, as a first polishing process, to obtain a pattern substrate (a) which had been flattened (polishing time: 180 seconds, maximum polishing thickness: 1.6 μm).

Pattern substrate (b): It was produced in the same manner as for the pattern substrate (a) except that silicon dioxide was used as the interlayer insulating film.

Examples 1 to 27 and Comparative Examples 1 to 4

Using each of the above prepared polishing slurry, each substrate prepared above was chemically and mechanically polished under the following polishing conditions. The copper etching speed was measured by immersion into each polishing slurry under the following conditions. Results of evaluation of the polishing speed by chemical mechanical polishing, in-plane uniformity of polishing speed, copper etching speed, dishing amount, erosion amount and wiring resistance, amount of polishing foreign matters, and scratches are shown in Tables 6 to 10.

(Polishing Condition)[Common to First Polishing Process which is Pre-treatment of the Above-mentioned Pattern Substrate, and the Following Polishing of Each Substrate]

Polishing pad: foamed polyurethane resin (IC1000 (manufactured by Rodel))

Polishing pressure: 20.6 kPa (210 g/cm$^2$)

Relative speed of substrate and polishing plate: 36 m/min (Polishing Process of Each Substrate)

The blanket substrates (a), (b), (c) and (d) were chemically and mechanically polished for 60 seconds while feeding each polishing slurry prepared above at 150 cc/minute, and after completion of polishing, washing treatment was conducted with distilled water.

The pattern substrates (a) and (b) were chemically and mechanically polished for 90 seconds while feeding each polishing slurry prepared above at 150 cc/minute, and after completion of polishing, washing treatment was conducted with distilled water. Polishing of the pattern substrates (a) and (b) corresponded to the second polishing process, and the interlayer insulating film at the convex portion was all exposed on the polished surface at about 30 seconds, and after completion of polishing, it was over-polished.

(Evaluation Items)

(1) Polishing speed: The polishing speeds of the organosilicate glass (a) and silicon dioxide (b), of the blanket substrates (a) to (d) polished and washed under the above-mentioned conditions were obtained by measuring a difference in film thickness before and after polishing using a film thickness measuring apparatus manufactured by Dainippon Screen MFG Co. LTD (product name: Lambda Ace VL-M8000LS). The polishing speeds of the tantalum film (c) and copper (d) were obtained by converting a difference in film thickness before and after polishing based on electric resistance.

(2) In-plane uniformity of polishing speed: The standard deviation of the above-mentioned polishing speed (1) was represented in terms of percentage (%) based on the average value.

(3) Copper etching speed: It was obtained by converting a difference in copper film thickness before and after immersion of the blanket substrate (d) into polishing slurry (25° C., stirring: 100 rpm) under stir for 60 seconds, based on electric resistance value.

(4) Flatness (dishing amount): From the surface form of the stripe pattern parts composed of wiring metal (copper) parts having a width of 100 μm and interlayer insulating film parts having a width of 100 μm mutually arranged (hereinafter, referred to as dishing evaluation part), of the pattern substrates (a) and (b) polished and washed under the above-mentioned conditions, the amount of film reduction at the wiring metal part based on the insulating film part was measured by a stylus type level meter.

(5) Flatness (erosion amount): The surface form of the stripe pattern parts having a total width of 2.5 mm composed of wiring metal parts having a width of 4.5 μm and interlayer insulating film parts having a width of 0.5 μm mutually arranged (hereinafter, referred to as erosion evaluation part), formed on the pattern substrates (a) and (b) was measured by a stylus type level meter, to obtain the amount of film reduction at the interlayer insulating film parts around the center of the stripe pattern parts based on the insulating film parts around the stripe patterns.

(6) Wiring resistance: The wiring resistance of a wiring length of 1 mm was measured at the above-mentioned dishing evaluation part (4). The wiring resistance of a wiring length of 1 mm was measured at the above-mentioned erosion evaluation part (4).

(7) Washing property (amount of polishing foreign materials): The amount of residue materials remaining on the surface of the pattern substrates (a) and (b) was observed using SEM and washing property was evaluated by the number of residue materials per 1 cm$^2$.

(8) Scratches: The amount of scratches was measured from the pattern substrates (a) and (b) using a pattern wafer defect detection apparatus 2138 manufactured by KLA Tenocor, and evaluated by the number of scratches per 1 cm$^2$.

TABLE 6

| | Evaluation result | | Example 1 | Example 2 | Example 3 | Example 4 | Example 5 | Example 6 | Example 7 |
|---|---|---|---|---|---|---|---|---|---|
| Polishing speed (Å/min) | Organosilicate glass | | 720 | 600 | 780 | 610 | 590 | 750 | 580 |
| | Silicon dioxide | | 560 | 670 | 620 | 550 | 540 | 670 | 490 |
| | Tantalum film | | 600 | 520 | 420 | 520 | 600 | 570 | 610 |
| | Copper | | 310 | 300 | 310 | 300 | 290 | 280 | 310 |
| In-plane uniformity (%) of polishing speed | Organosilicate glass | | 4.5 | 5.8 | 4.5 | 3.8 | 5.2 | 5.6 | 5.2 |
| | Silicon dioxide | | 3.2 | 4.4 | 3.1 | 4.5 | 5.4 | 4.5 | 3.1 |
| | Tantalum film | | 5.8 | 5.5 | 3.3 | 5.2 | 5.3 | 5.3 | 5.4 |
| | Copper | | 7.5 | 6.9 | 7.2 | 6.5 | 6.9 | 6.9 | 7.1 |
| Copper etching speed (Å/min) | | | 30 | 20 | 50 | 15 | 20 | 30 | 10 |
| Pattern substrate (a): using organosilicate glass | Dishing amount (Å) | | 370 | 650 | 700 | 700 | 700 | 650 | 480 |
| | Erosion amount (Å) | | 300 | 630 | 560 | 700 | 640 | 540 | 450 |
| | Wiring resistance (Ω) | Dishing evaluation part | 0.352 | 0.368 | 0.361 | 0.372 | 0.362 | 0.368 | 0.365 |
| | | Erosion evaluation part | 7.01 | 7.08 | 7.10 | 7.09 | 7.05 | 7.10 | 7.05 |

TABLE 6-continued

| | Evaluation result | Example 1 | Example 2 | Example 3 | Example 4 | Example 5 | Example 6 | Example 7 |
|---|---|---|---|---|---|---|---|---|
| | Amount of polishing foreign materials (number/cm$^2$) | 1.1 | 0.8 | 0.2 | 0.7 | 1.2 | 2.0 | 0.4 |
| | Amount of scratch (number/cm$^2$) | 0.1 | 0.3 | 0.2 | 0.2 | 0.1 | 0.2 | 0.7 |
| Pattern substrate (b): using silicon dioxide | Dishing amount (Å) | 360 | 450 | 440 | 420 | 520 | 410 | 520 |
| | Erosion amount (Å) | 450 | 400 | 440 | 510 | 430 | 530 | 570 |
| | Wiring resistance (Ω) Dishing evaluation part | 0.364 | 0.357 | 0.364 | 0.355 | 0.361 | 0.354 | 0.363 |
| | Wiring resistance (Ω) Erosion evaluation part | 7.10 | 7.06 | 7.11 | 7.05 | 7.10 | 7.10 | 7.07 |
| | Amount of polishing foreign materials (number/cm$^2$) | 1.2 | 2.0 | 0.4 | 0.8 | 1.2 | 0.2 | 0.8 |
| | Amount of scratch (number/cm$^2$) | 1.4 | 0.2 | 2.0 | 0.2 | 1.3 | 0.7 | 0.7 |

TABLE 7

| | Evaluation result | | Example 8 | Example 9 | Example 10 | Example 11 | Example 12 | Comp. Example 1 | Comp. Example 2 |
|---|---|---|---|---|---|---|---|---|---|
| Polishing speed (Å/min) | Organosilicate glass | | 320 | 770 | 650 | 625 | 650 | 120 | 150 |
| | Silicon dioxide | | 290 | 450 | 580 | 520 | 570 | 220 | 210 |
| | Tantalum film | | 550 | 540 | 550 | 560 | 560 | 450 | 510 |
| | Copper | | 120 | 130 | 310 | 310 | 290 | 320 | 300 |
| In-plane uniformity (%) of polishing speed | Organosilicate glass | | 4.5 | 3.1 | 5.3 | 3.4 | 3.3 | 8.2 | 10.1 |
| | Silicon dioxide | | 5.2 | 4.1 | 4.5 | 5.3 | 4.5 | 8.4 | 8.3 |
| | Tantalum film | | 3.7 | 4.2 | 5.3 | 4.5 | 4.1 | 6.4 | 6.5 |
| | Copper | | 7.8 | 8.2 | 7.7 | 6.9 | 7.3 | 11.7 | 10.8 |
| Copper etching speed (Å/min) | | | 45 | 40 | 50 | 20 | 20 | 20 | 30 |
| Pattern substrate (a): using organosilicate glass | Dishing amount (Å) | | 550 | 610 | 500 | 650 | 650 | 2050 | 3200 |
| | Erosion amount (Å) | | 520 | 390 | 540 | 560 | 670 | 2700 | 2590 |
| | Wiring resistance (Ω) | Dishing evaluation part | 0.363 | 0.362 | 0.368 | 0.359 | 0.363 | 0.398 | 0.450 |
| | | Erosion evaluation part | 7.06 | 7.07 | 7.06 | 7.01 | 7.03 | 7.25 | 8.02 |
| | Amount of polishing foreign materials (number/cm$^2$) | | 0.3 | 1.9 | 1.0 | 0.3 | 0.2 | 5.6 | 5.8 |
| | Amount of scratch (number/cm$^2$) | | 0.7 | 1.1 | 0.3 | 1.1 | 0.3 | 6.9 | 10.8 |
| Pattern substrate (b): using silicon dioxide | Dishing amount (Å) | | 510 | 450 | 530 | 600 | 510 | 1850 | 2850 |
| | Erosion amount (Å) | | 480 | 400 | 610 | 450 | 450 | 2010 | 2350 |
| | Wiring resistance (Ω) | Dishing evaluation part | 0.354 | 0.363 | 0.364 | 0.352 | 0.368 | 0.418 | 0.460 |
| | | Erosion evaluation part | 7.05 | 7.08 | 7.07 | 7.10 | 7.05 | 7.35 | 7.95 |
| | Amount of polishing foreign materials (number/cm$^2$) | | 0.6 | 0.6 | 1.1 | 1.2 | 1.1 | 5.4 | 5.3 |
| | Amount of scratch (number/cm$^2$) | | 2.0 | 0.8 | 1.2 | 0.2 | 0.2 | 6.3 | 10.1 |

TABLE 8

| Evaluation result | | Example 13 | Example 14 | Example 15 | Example 16 | Example 17 |
|---|---|---|---|---|---|---|
| Polishing speed (Å/min) | Organosilicate glass | 740 | 760 | 620 | 600 | 510 |
| | Silicon dioxide | 570 | 620 | 640 | 570 | 450 |
| | Tantalum film | 610 | 440 | 530 | 500 | 420 |
| | Copper | 300 | 310 | 320 | 290 | 280 |
| In-plane uniformity (%) of polishing speed | Organosilicate glass | 3.7 | 4.1 | 4.9 | 4.2 | 5.8 |
| | Silicon dioxide | 3.1 | 4.3 | 3.6 | 3.9 | 5.1 |
| | Tantalum film | 6.1 | 4.8 | 6.5 | 6.1 | 5.5 |
| | Copper | 8.4 | 6.5 | 7.1 | 6.3 | 7.3 |
| Copper etching speed (Å/min) | | 20 | 10 | 50 | 50 | 30 |
| Pattern substrate (a): using organosilicate glass | Dishing amount (Å) | 390 | 380 | 750 | 700 | 600 |
| | Erosion amount (Å) | 330 | 310 | 700 | 700 | 540 |
| | Wiring resistance (Ω) — Dishing evaluation part | 0.353 | 0.353 | 0.374 | 0.369 | 0.365 |
| | Wiring resistance (Ω) — Erosion evaluation part | 7.02 | 7.01 | 7.11 | 7.10 | 7.05 |
| | Polishing foreign materials amount (number/cm$^2$) | 1.2 | 0.9 | 2.1 | 1.8 | 0.9 |
| | Amount of scratch (number/cm$^2$) | 0.3 | 0.2 | 0.7 | 0.9 | 0.5 |
| Pattern substrate (b): using silicon dioxide | Dishing amount (Å) | 370 | 340 | 720 | 700 | 520 |
| | Erosion amount (Å) | 320 | 310 | 680 | 650 | 500 |
| | Wiring resistance (Ω) — Dishing evaluation part | 0.354 | 0.350 | 0.372 | 0.371 | 0.363 |
| | Wiring resistance (Ω) — Erosion evaluation part | 7.01 | 7.02 | 7.09 | 7.10 | 7.04 |
| | Polishing foreign materials amount (number/cm$^2$) | 1.1 | 1.3 | 2.4 | 2.1 | 1.5 |
| | Amount of scratch (number/cm$^2$) | 0.1 | 0.2 | 0.3 | 0.5 | 0.2 |

TABLE 9

| Evaluation result | | Example 18 | Example 19 | Comparative Example 3 | Comparative Example 4 |
|---|---|---|---|---|---|
| Polishing speed (Å/min) | Organosilicate glass | 590 | 700 | 110 | 140 |
| | Silicon dioxide | 480 | 610 | 410 | 520 |
| | Tantalum film | 530 | 590 | 480 | 530 |
| | Copper | 280 | 330 | 320 | 300 |
| In-plane uniformity (%) of polishing speed | Organosilicate glass | 5.3 | 3.4 | 8.1 | 9.4 |
| | Silicon dioxide | 5.7 | 4.6 | 8.5 | 8.0 |
| | Tantalum film | 3.9 | 5.7 | 6.8 | 6.9 |
| | Copper | 9.2 | 9.0 | 13.4 | 11.7 |
| Copper etching speed (Å/min) | | 20 | 20 | 10 | 30 |
| Pattern substrate (a): using organosilicate glass | Dishing amount (Å) | 580 | 420 | 1100 | 1800 |
| | Erosion amount (Å) | 620 | 350 | 1000 | 1500 |
| | Wiring resistance (Ω) — Dishing evaluation part | 0.363 | 0.363 | 0.383 | 0.389 |
| | Wiring resistance (Ω) — Erosion evaluation part | 7.07 | 7.03 | 7.13 | 7.18 |
| | Polishing foreign materials amount (number/cm$^2$) | 0.8 | 0.9 | 5.6 | 5.8 |
| | Amount of scratch (number/cm$^2$) | 0.3 | 0.2 | 4.1 | 4.8 |
| Pattern substrate (b): using | Dishing amount (Å) | 570 | 350 | 1000 | 1900 |
| | Erosion amount (Å) | 560 | 330 | 1200 | 1500 |
| | Wiring Dishing | 0.363 | 0.357 | 0.381 | 0.390 |

TABLE 9-continued

| Evaluation result | | | Example 18 | Example 19 | Comparative Example 3 | Comparative Example 4 |
|---|---|---|---|---|---|---|
| silicon dioxide | resistance (Ω) | evaluation part | | | | |
| | | Erosion evaluation part | 7.07 | 7.03 | 7.15 | 7.18 |
| | Polishing foreign materials amount (number/cm²) | | 1.7 | 1.1 | 4.7 | 5.1 |
| | Amount of scratch (number/cm²) | | 0.4 | 0.1 | 3.8 | 3.2 |

TABLE 10

| Evaluation result | | | Exam. 20 | Exam. 21 | Exam. 22 | Exam. 23 | Exam. 24 | Exam. 25 | Exam. 26 | Exam. 27 |
|---|---|---|---|---|---|---|---|---|---|---|
| Polishing speed (Å/min) | Organosilicate glass | | 420 | 560 | 700 | 640 | 590 | 650 | 560 | 520 |
| | Silicon dioxide | | 660 | 760 | 670 | 650 | 590 | 610 | 480 | 540 |
| | Tantalum film | | 480 | 500 | 520 | 510 | 570 | 590 | 560 | 310 |
| | Copper | | 290 | 270 | 310 | 330 | 280 | 290 | 290 | 190 |
| In-plane uniformity (%) of polishing speed | Organosilicate glass | | 4.9 | 5.1 | 5.3 | 4.2 | 5.1 | 5.2 | 5.4 | 5.1 |
| | Silicon dioxide | | 4.4 | 5.8 | 3.9 | 5.4 | 5.6 | 5.1 | 4.7 | 7.1 |
| | Tantalum film | | 4.5 | 4.5 | 4.3 | 5.1 | 5.0 | 5.4 | 5.7 | 4.9 |
| | Copper | | 6.3 | 6.6 | 5.8 | 5.8 | 6.4 | 6.1 | 7.5 | 5.9 |
| Copper etching speed (Å/min) | | | 25 | 23 | 25 | 35 | 25 | 35 | 30 | 35 |
| Pattern substrate (a): using organosilicate glass | Dishing amount (Å) | | 450 | 450 | 650 | 550 | 700 | 570 | 580 | 480 |
| | Erosion amount (Å) | | 450 | 600 | 740 | 710 | 660 | 640 | 480 | 450 |
| | Wiring resistance (Ω) | Dishing evaluation part | 0.35 | 0.37 | 0.36 | 0.36 | 0.37 | 0.37 | 0.37 | 0.37 |
| | | Erosion evaluation part | 7.02 | 7.03 | 7.11 | 7.06 | 7.09 | 7.12 | 7.08 | 7.10 |
| | Amount of polishing foreign materials (number/cm²) | | 0.1 | 0.3 | 0.3 | 0.9 | 1.1 | 2.1 | 0.2 | 0.3 |
| | Amount of scratch (number/cm²) | | 1.3 | 1.0 | 0.4 | 0.5 | 0.6 | 0.2 | 0.9 | 0.9 |
| Pattern substrate (b): using silicon dioxide | Dishing amount (Å) | | 390 | 550 | 480 | 500 | 580 | 460 | 500 | 600 |
| | Erosion amount (Å) | | 600 | 540 | 410 | 480 | 500 | 510 | 530 | 430 |
| | Wiring resistance (Ω) | Dishing evaluation part | 0.36 | 0.36 | 0.36 | 0.36 | 0.37 | 0.36 | 0.36 | 0.37 |
| | | Erosion evaluation part | 7.11 | 7.16 | 7.13 | 7.04 | 7.11 | 7.05 | 7.09 | 7.10 |
| | Amount of polishing foreign materials (number/cm²) | | 2.2 | 2.1 | 0.8 | 0.9 | 2.2 | 0.4 | 0.5 | 1.1 |
| | Amount of scratch (number/cm²) | | 0.4 | 0.6 | 2.1 | 0.3 | 1.1 | 0.8 | 0.5 | 0.9 |

In Comparative Examples 1 to 4, the polishing speed of organosilicate glass is small and the in-plane uniformity of the polishing speed is large, therefore, dishing and erosion are large and wiring resistance is increased. Further, in Comparative Examples 1 to 4, the amount of polishing foreign materials and the amount of scratches are large. In contrast, in Examples 1 to 27, the polishing speed of organosilicate glass or silicon dioxide is large and the in-plane uniformity of the polishing speed is excellent, therefore, increase in wiring resistance is small due to excellent dishing and erosion properties. The amount of polishing foreign materials and the amount of scratches are small, indicating preferable results.

INDUSTRIAL APPLICABILITY

According to the polishing slurry of the present invention, a polished surface having high flatness is obtained even if the polished surface is made of two or more substances. Metal residue and scratches after polishing can be suppressed. Further, the polishing speed of an interlayer insulating film can be increases without decreasing the polishing speed of the barrier layer, and the polishing speed of a metal for wiring part can be controlled. The polishing method of the present invention of effecting chemical mechanical polishing using this polishing slurry is suitable for production of a semiconductor device and other electronic appliances excellent in productivity, fineness, film thinness, dimension precision and electric property, and having high reliability.

What is claimed:

1. A polishing method comprising;
   a process of preparing a substrate having
   an interlayer insulating layer carrying a surface composed of a concave portion and a convex portion,
   a barrier layer coating the interlayer insulating layer along its surface, and
   a conductive substance layer filling the concave portion and coating the barrier layer,
   a first polishing process of polishing the conductive substance layer to expose the barrier conductor layer on the convex portion of the interlayer insulating layer and the conductive substance layer filling the concave portion of the interlayer insulating layer,
   a second polishing process of polishing the exposed barrier layer and the exposed conductive substance layer on the concave portion to expose the convex portion of the interlayer insulating layer, the barrier layer coating the concave portion of the interlayer insulating layer and the conductive substance layer filling the concave portion while feeding a polishing slurry, and
   a third polishing process of over polishing a part of the convex portion of the interlayer insulating layer,
   wherein the polishing slurry comprises a surfactant, a metal oxide dissolving agent and water,
   wherein the second polishing process and the third polishing process are conducted in one step, and
   wherein the surfactant is at least one selected from perfluoroalkanesulfonic acids and derivatives thereof.

2. The polishing method according to claim 1, wherein the surfactant is at least one selected from nonionic surfactants and anionic surfactants.

3. The polishing method according to claim 1, wherein the surfactant is contained in a proportion of 0.00001 to 20 wt %.

4. The polishing method according to claim 1, wherein the polishing slurry further comprises an organic solvent.

5. The polishing method according to claim 1, wherein the polishing slurry further comprises abrasive, wherein the surface of the abrasive is modified with an alkyl group.

* * * * *